United States Patent [19]
Suzuki et al.

[11] Patent Number: 5,683,790
[45] Date of Patent: Nov. 4, 1997

[54] MULTILAYER CERAMIC PARTS

[75] Inventors: Kazuaki Suzuki; Makoto Kobayashi, both of Chiba; Taro Miura, Tokyo; Keizou Kawamura, Chiba, all of Japan

[73] Assignee: TDK Corporation, Tokyo, Japan

[21] Appl. No.: 514,796

[22] Filed: Aug. 14, 1995

Related U.S. Application Data

[63] Continuation of Ser. No. 172,823, Dec. 27, 1993, abandoned.

[30] Foreign Application Priority Data

| Dec. 28, 1992 | [JP] | Japan | 4-361377 |
| Sep. 30, 1993 | [JP] | Japan | 5-267971 |

[51] Int. Cl.$^6$ ............................ B32B 3/00; B32B 15/00; C03C 27/04; C03C 8/22
[52] U.S. Cl. .......................... 428/210; 428/209; 428/433; 428/633; 428/901; 501/16; 501/137; 501/138; 156/89
[58] Field of Search .................... 428/210, 209, 428/901, 433, 633; 501/16, 137, 138; 333/168; 156/89

[56] References Cited

U.S. PATENT DOCUMENTS

| 4,109,377 | 8/1978 | Blazick et al. | 29/831 |
| 4,748,086 | 5/1988 | Akoh | 428/433 |
| 5,077,247 | 12/1991 | Sato | 501/137 |
| 5,138,298 | 8/1992 | Shino | 338/21 |
| 5,175,518 | 12/1992 | Swanson | 333/168 |
| 5,223,462 | 6/1993 | Okawa | 501/138 |
| 5,229,213 | 7/1993 | Horiuchi et al. | 428/457 |
| 5,235,310 | 8/1993 | Gowman | 338/21 |
| 5,316,985 | 5/1994 | Jean | 501/16 |
| 5,350,639 | 9/1994 | Inoue | 428/633 |

FOREIGN PATENT DOCUMENTS

| 0 210 502 | 2/1987 | European Pat. Off. |
| 0 564 652 | 10/1993 | European Pat. Off. |
| 53-53774 | 5/1978 | Japan. |
| 2 122598 | 5/1990 | Japan. |
| 2 197189 | 8/1990 | Japan. |
| 3 290358 | 12/1991 | Japan. |
| 3 290359 | 12/1991 | Japan. |
| 3 295854 | 12/1991 | Japan. |
| 3 295855 | 12/1991 | Japan. |
| 3 295856 | 12/1991 | Japan. |
| 3 295858 | 12/1991 | Japan. |
| 3 295859 | 12/1991 | Japan. |
| 4 146478 | 5/1992 | Japan. |
| 5 183314 | 7/1993 | Japan. |
| 5 234420 | 9/1993 | Japan. |

OTHER PUBLICATIONS

Japan Ceramic Association, 6th Autumn Conference, 1993, K. Suzuki, et al., "Electronic Parts Using High Temperature Cofired Dielectrics", 1 page, with partial English translation.
Japan Ceramic Association, 1992 Conference, K. Kawamura, et al., "Higher Q Microwave Resonator Using Low Temperature Fireable Dielectrices", p. 346, with partial English translation.

*Primary Examiner*—Patrick Ryan
*Attorney, Agent, or Firm*—Oblon, Spivak, McClelland, Maier & Neustadt, P.C.

[57] ABSTRACT

A multilayer ceramic part including dielectric ceramic layers and internal conductor layers is prepared by forming dielectric ceramic layers from an oxide system dielectric ceramic material having a sintering completion temperature between the melting point and the boiling point of the internal conductor. A pattern of internal conductor is formed on dielectric ceramic layers. The dielectric ceramic layers are placed one on another so as to sandwich the internal conductor pattern therebetween. The laminate is fired at or above the melting point of the internal conductor, optionally in an atmosphere having a controlled oxygen partial pressure. Since the dielectric ceramic material has an improved dielectric constant and dielectric loss and the internal conductor is densified and improved in surface property, the part is improved in resonator Q value and other properties. This minimizes the occurrence of defective parts in which the internal conductor is separated from the dielectric ceramic layer and minimizes a failure in the internal conductor layer.

12 Claims, 3 Drawing Sheets

F I G. 1
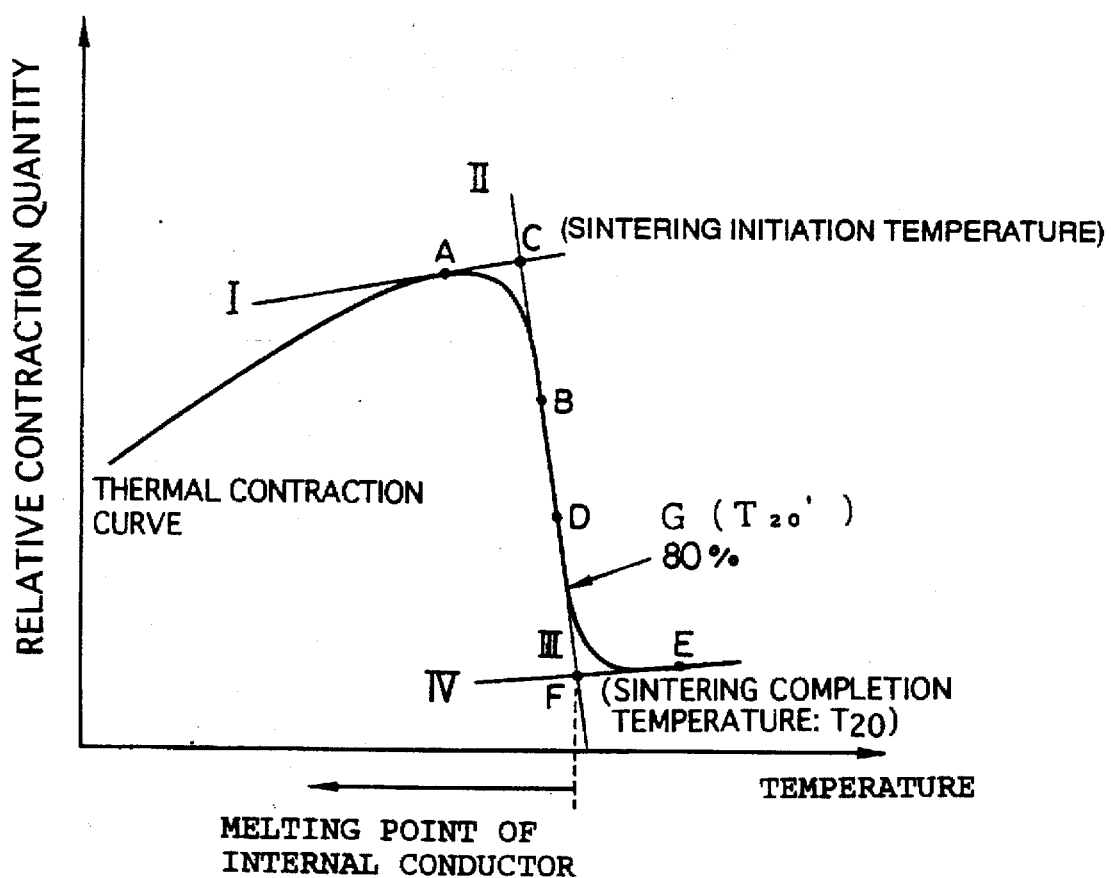

F I G. 4
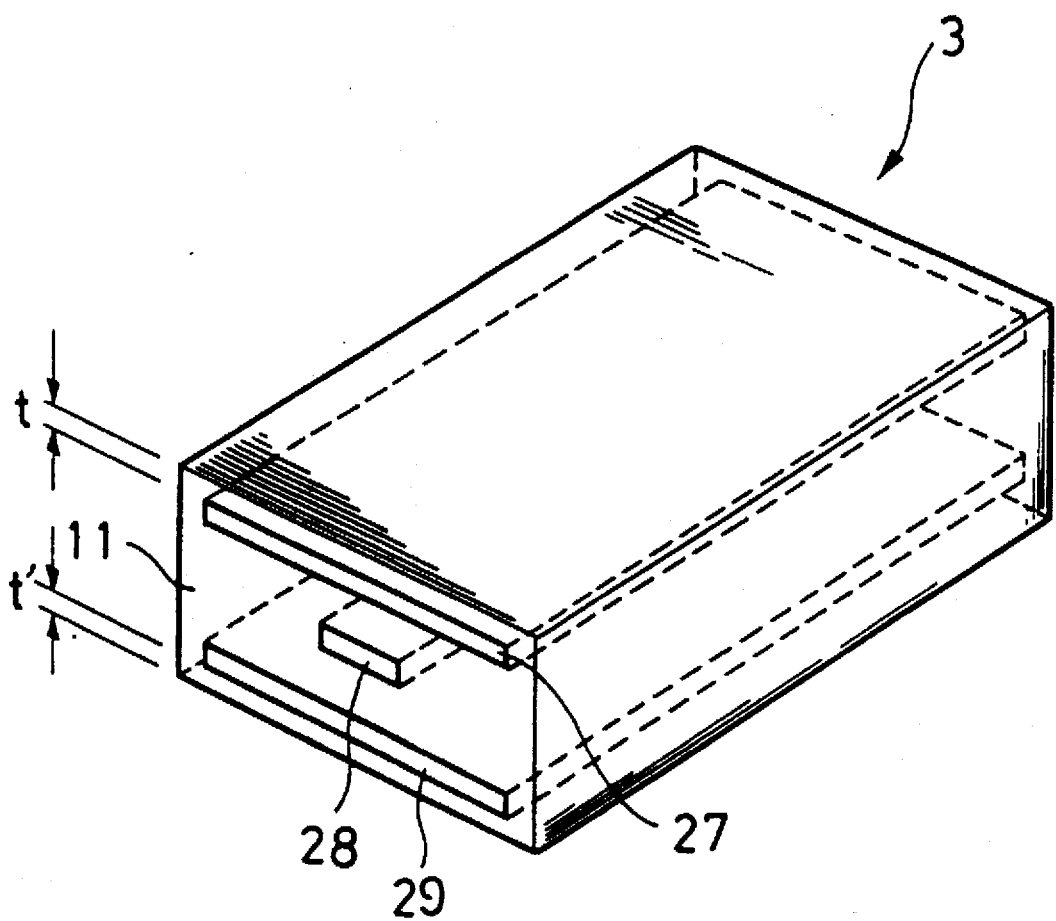

MULTILAYER CERAMIC PARTS

This application is a Continuation of application Ser. No. 08/172,823, filed on Dec. 27, 1993, now abandoned.

BACKGROUND OF THE INVENTION

1. Field of the Invention

This invention relates to multilayer ceramic parts mainly for use as dielectric resonators and filters operating in the microwave region.

2. Prior Art

As the operating frequency range of multilayer ceramic parts, typically dielectric resonators is expanded, it is desired to reduce the size of dielectric resonators, especially those operating in the microwave region. To meet such a demand, various dielectric ceramic materials have been developed for microwave application. For a compact size design, dielectric ceramic materials having a high dielectric constant are required.

Also, one common practice for improving resonance properties is to stack layers of ceramic material while interposing an adequate conductor material for microwave application such as silver and copper as internal electrodes. In fabricating multilayer ceramic parts such as resonators, green sheet and lamination printing methods have been used wherein conductor material and ceramic material are co-fired.

In order for such methods to achieve satisfactory characteristics, it was believed necessary to prevent the internal conductor material from melting. This meant that firing should be done at temperatures below the melting point of the internal conductor material. Then it was believed that ceramic materials to be fired at high temperatures could not be used even if they had good dielectric properties. For this reason, a number of proposals have been made on low-temperature firing dielectric ceramic materials as disclosed in Japanese Patent Application Kokai (JP-A) Nos. 295854/1991, 295855/1991, 295856/1991, 295858/1991, and 295859/1991.

Nevertheless, making investigations on the above-mentioned prior art methods, we found that improvements in various properties, typically an improvement in the Q value of resonators can be accomplished by co-firing dielectric ceramic material and internal conductor material at a temperature above the melting point of the internal conductor material, thereby melting and densifying the internal conductor to substantially eliminate grain boundaries within the internal conductor attributable to conductor grains. These proposals are disclosed in Japanese Patent Application Nos. 306760/1991, 360323/1991, 134199/1992, 146478/1992, and 313997/1992.

These proposals, however, employ low-temperature firing ceramic materials. In co-firing such ceramic material and internal conductor so as to cause melting of the internal conductor, there often occurs a lowering of the Q value of resonators probably because of deteriorated surface property of the internal conductor or other factors. There is a need for improvement in this respect.

JP-A 197189/1990 discloses to fire an aluminum nitride circuit board having an internal conductor formed of gold, silver, copper or a mixture thereof. The optimum firing temperature for such an aluminum nitride circuit board is above the melting temperature of the internal conductor so that the internal conductor is substantially melted upon firing. In this disclosure, it is alleged that by utilizing the poor wettability and rapid densification of aluminum nitride, a conductor circuit or internal wiring can be formed in the aluminum nitride circuit board even when an internal conductor material having a relatively low melting temperature such as gold, silver and copper is used. It is believed that densification of the internal conductor due to melting has taken place in this circuit board as in the present invention.

However, there is known no example of fabricating multilayer ceramic parts such as resonators for high frequency application (for example, of the order of 200 MHz to 10 GHz) using such aluminum nitride. In high-frequency parts having the requirement of size reduction, it is generally difficult to use materials having a relative low dielectric constant such as aluminum nitride and even if possible, the resulting parts become of large size. In addition, since aluminum nitride is less wettable to molten metal, the internal conductor is surely densified, but defects are often formed at the interface and in an extreme case, the conductor pattern is narrowed or even broken. For the high-frequency parts having the requirement of size reduction, it is necessary to reduce the thickness of dielectric layers and to reduce the thickness and width of internal conductor layers into thinner and narrower strips. Particularly when thinner and narrower strips are desired, the occurrence of such defects as breakage of the internal conductor layers becomes substantial.

In firing multilayer composite parts which uses silver as the internal conductor and oxide as the dielectric ceramic material wherein the dielectric ceramic material layer between the internal conductor and the part outer surface is thin, there are produced many defective parts in which the internal conductor is separated from the dielectric ceramic layer.

SUMMARY OF THE INVENTION

Therefore, an object of the present invention is to provide a multilayer ceramic part having dielectric ceramic layers and internal conductor layers which is improved in various properties, typically Q value when used as a resonator, by using a dielectric ceramic material having improved dielectric properties including a dielectric constant and a dielectric loss and firing so that the internal conductor is densified and improved in surface property.

Another object of the present invention is to provide such a multilayer ceramic part which minimizes the occurrence of defective parts in which the internal conductor is separated from the dielectric ceramic layer and minimizes a failure in the internal conductor layer.

The present invention provides a multilayer ceramic part comprising a plurality of dielectric ceramic layers and at least one internal conductor layer interposed therebetween. The part is prepared by forming dielectric ceramic layers from a dielectric ceramic material. The dielectric ceramic material is of an oxide system and has a sintering completion temperature between the melting point and the boiling point of the internal conductor. The sintering completion temperature is determined from a thermal contraction curve at a heating rate of 200° C./hour as will be described later. A pattern of internal conductor is formed on one of the dielectric ceramic layers. Another of the dielectric ceramic layer is placed on the one dielectric ceramic layer so as to sandwich the internal conductor pattern therebetween, providing a laminate. Thereafter the laminate is fired at a temperature equal to or above the melting point of the internal conductor. The steps of forming an internal conductor pattern and stacking dielectric ceramic layers are respectively repeated as desired. An internal conductor pattern may be formed only on selected ones of the dielectric ceramic layers.

In one preferred embodiment, the firing temperature is at or above the sintering completion temperature.

Preferably, the dielectric ceramic material has a dielectric constant of 6.5 to 120 at 20° C. The dielectric ceramic material is selected from the group consisting of MgO-SiO$_2$, CaO-MgO-TiO$_2$, BaO-TiO$_2$-SnO$_2$, BaO-MgO-CoO-Nb$_2$O$_5$, BaO-Nd$_2$O$_3$-TiO$_2$-Bi$_2$O$_3$-Al$_2$O$_3$-MnO, BaO-MgO-Ta$_2$O$_5$, ZrO$_2$-SnO$_2$-TiO$_2$, PbO-CaO-ZrO$_2$, SrO-ZrO$_2$-TiO$_2$, BaO-Sm$_2$O$_5$-TiO$_2$, PbO-BaO-Nd$_2$O$_3$-TiO$_2$, and Li$_2$O-Na$_2$O-Sm$_2$O$_5$-TiO$_2$ systems.

Preferably, the internal conductor contains at least 90% by weight of silver or copper.

Where the internal conductor is formed of silver, the laminate is fired in an atmosphere having an oxygen partial pressure of up to $1\times10^{-1}$ atm.

In one embodiment, one of the dielectric ceramic layers is the outermost layer of the part, and the distance from the surface of the internal conductor layer located on the outermost layer side to the outer surface of the outermost layer is up to 500 μm. In this embodiment, the dielectric ceramic material is selected from the group consisting of CaO-MgO-TiO$_2$, BaO-TiO$_2$-SnO$_2$, BaO-Nd$_2$O$_3$-TiO$_2$-Bi$_2$O$_3$-Al$_2$O$_3$-MnO, BaO-MgO-Ta$_2$O$_5$, ZrO$_2$-SnO$_2$-TiO$_2$, SrO-ZrO$_2$-TiO$_2$, BaO-Sm$_2$O$_5$-TiO$_2$, PbO-BaO-Nd$_2$O$_3$-TiO$_2$, and Li$_2$O-Na$_2$O-Sm$_2$O$_5$-TiO$_2$ systems and the laminate is fired in an atmosphere having an oxygen partial pressure of from more than $1\times10^{-4}$ atm. to $1\times10^{-1}$ atm.

Where the internal conductor is formed of copper, the laminate is fired in an atmosphere having an oxygen partial pressure of up to $1\times10^{-6}$ atm. The dielectric ceramic material used herein is selected from the group consisting of MgO-SiO$_2$, BaO-MgO-CoO-Nb$_2$O$_5$, and PbO-CaO-ZrO$_2$ systems.

BRIEF DESCRIPTION OF THE DRAWINGS

FIG. 1 is a graph showing a thermal contraction curve that a dielectric ceramic material follows when heated at a rate of 200° C./hour.

FIG. 4 is a schematic view showing the structure of a multilayer filter according to a further embodiment of the invention.

DETAILED DESCRIPTION OF THE INVENTION

Figure 2:
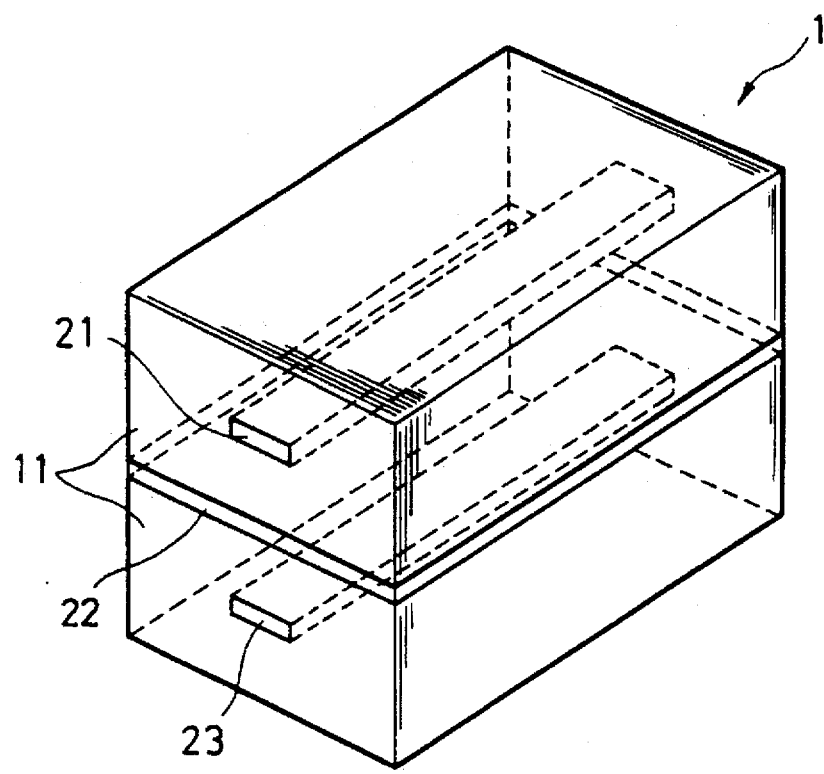
FIG. 2 is a schematic view showing the structure of a multilayer filter according to one embodiment of the invention.

The multilayer ceramic part of the present invention is fabricated by forming green sheets of a dielectric ceramic material, forming a pattern of internal conductor on one green sheet, placing the green sheets one on top of the other, pressing the laminate under pressure, and firing the laminate. This method is referred to as a green sheet method. Alternatively, it is possible to alternately apply a dielectric paste and an internal conductor paste to form alternating layers, which is referred to as a printing lamination method.

More particularly, the dielectric ceramic material used herein has a sintering completion temperature as determined from a thermal contraction curve at a heating rate of 200° C./hour which is between the melting point and the boiling point of the internal conductor and the laminate is fired at a temperature equal to or above the melting point of the internal conductor. The present invention is characterized in that a dielectric ceramic material known as high-temperature firing ceramic material is used and firing is done such that the internal conductor is melted while causing the ceramic material to form a sintered body. To this end, the laminate is fired at a temperature equal to or above the melting point of the internal conductor and equal to or above the sintering completion temperature of the ceramic material.

The term "sintering completion temperature" used herein is a theoretical temperature at which ceramic material forms a sintered body. It is determined from a thermal contraction curve as described below in conjunction with FIG. 1.

In the present invention, the sintering completion temperature is a temperature equal to or above the melting point of the internal conductor, preferably above the internal conductor's melting point+50° C., more preferably above the internal conductor's melting point+100° C., most preferably above the internal conductor's melting point+150° C. In connection with a thermal contraction curve as shown in FIG. 1, the temperature $T_{20}'$ (point G in FIG. 1) corresponding to 80% from point C of the distance between a sintering initiation temperature (point C in FIG. 1) and a sintering completion temperature $T_{20}$ (point F in FIG. 1) which are determined from the curve of FIG. 1 is preferably equal to or above the melting point of the internal conductor, more preferably above the internal conductor's melting point+20° C., most preferably above the internal conductor's melting point+50° C. Since the internal conductor can evaporate at extremely high temperatures which affords an extremely high vapor pressure, the upper limit of the sintering completion temperature is equal to or below the boiling point of the internal conductor. Often, the sintering completion temperature is 960° to 1900° C., preferably 1100° to 1700° C. It is to be noted that the melting point and boiling point of the internal conductor are the melting point and boiling point of internal conductor metal (inclusive of alloy) generally as determined in bulk state.

The actual firing temperature is equal to or above the sintering completion temperature. This relationship applies only to the sintering completion temperature which is determined from a thermal contraction curve given under the same condition as the heating rate which is used until the actual firing temperature is reached. The heating rate of 200° C./hour is employed in conventional firing process. With the same heating rate, the actual firing temperature $T_2$ is in the range from the sintering completion temperature $T_{20}$ to a temperature 70° C. higher than $T_{20}$. Therefore, actual firing temperature $T_2$, sintering completion temperature $T_{20}$, and the melting point mp of the internal conductor preferably have a relationship: $mp \leq T_{20} \leq T_2$.

For the multilayer ceramic part, the invention uses a dielectric ceramic material which is sintered at a temperature equal to or above the melting point of the internal conductor and effects firing at a temperature equal to or above the sintering completion temperature of the dielectric ceramic material so that gases generated from the internal conductor during firing can be discharged outside the dielectric ceramic material layers. The thus formed internal conductor is free of irregularities on the surface, that is, has a good surface state. This allows parts to have improved properties, for example, resulting in resonators with high Q values. The gases generated from the internal conductor during firing include carbon dioxide gas and water vapor released from vehicles such as binders and solvents.

It was believed in the past that in depositing a plurality of alternating layers of dielectric ceramic material and internal conductor and simultaneously firing the laminate, the use of a ceramic material which was to be sintered at a temperature above the melting point of the internal conductor should be avoided in order to prevent the internal conductor from melting. It was thus believed that a ceramic material having a high firing temperature could not be used though it had an improved dielectric constant and dielectric loss (Q·f value). See JP-A 290358/1991. However, the present invention intends to cause the internal conductor to be melted to thereby densify the structure of the internal conductor and improve the contact state thereof, resulting in the advantages of a reduced line loss and an increased resonator Q value. This allows for the use of a ceramic material having a high sintering temperature, high dielectric constant, and high Q·f value. By taking advantage of the improved properties of ceramic material itself, the invention provides resonators with high Q values.

If the sintering completion temperature is below the melting point of the internal conductor, the effect of improving the surface property of the internal conductor is lost. If the sintering completion temperature is above the boiling point of the internal conductor, the internal conductor is lost. If the firing temperature is below the melting point of the internal conductor, the ceramic material remains unsintered and the effect of melting the internal conductor is lost.

The "sintering completion temperature" is determined from a thermal contraction curve as shown in FIG. 1. As temperature rises, a ceramic material thermally expands along a certain path. At a particular temperature, the thermal expansion of the ceramic material deviates from the path. This point of inflection on the thermal contraction curve is designated A. Going past point A, the ceramic material starts contracting at a constant rate. The region of constant contraction starts at point B on the lowest temperature side and terminates at point D on the highest temperature side. Going past point D, the ceramic material ceases to contract. Next comes a region where little volume change occurs, which has point E on the lowest temperature side.

The intersection C between a tangent I at point A and a tangent II at point B is defined as the sintering initiation temperature, and the intersection F between a tangent III at point D and a tangent IV at point E is defined as the sintering completion temperature $T_{20}$.

The dielectric ceramic material used in the multilayer ceramic part of the present invention may be essentially any of dielectric ceramic materials as long as their sintering completion temperature satisfies the above-mentioned requirement. However, when it is intended to use dielectric layers in high-frequency resonators operating in the frequency range of 200 MHz to 10 GHz, there are known no examples using dielectric ceramic materials resulting from firing of ceramic materials of nitride and silicon carbide systems. These ceramic materials of nitride and silicon carbide systems are poor in wettability to molten metal, which metal is silver, copper or an alloy thereof used as the internal conductor. Since multilayer ceramic parts are desired to be reduced in size and thickness, the internal conductor layers therein are also required to be reduced in thickness and width. In firing such multilayer ceramic parts, dielectric layers of a less wettable ceramic material can increase the risk of inducing defects such as breakage of the internal conductor layers. For this reason, preferred dielectric ceramic materials are those ceramic materials which convert into an oxide or a mixture of oxides upon firing because oxide system ceramic materials are wettable enough to minimize failure such as breakage of the internal conductor layers. Exemplary are composite oxides obtained by firing materials as will be described later and mixtures of oxides partially having a rutile structure. Therefore, the multilayer ceramic part of the invention includes dielectric ceramic layers of an oxide or a mixture of oxides obtained by firing such a dielectric ceramic material.

Illustrative, non-limiting examples of the dielectric ceramic material used herein include $MgO\text{-}SiO_2$, $CaO\text{-}MgO\text{-}TiO_2$, $BaO\text{-}TiO_2\text{-}SnO_2$, $BaO\text{-}MgO\text{-}CoO\text{-}Nb_2O_5$, $BaO\text{-}Nd_2O_3\text{-}TiO_2\text{-}Bi_2O_3\text{-}Al_2O_3\text{-}MnO$ systems. The $MgO\text{-}SiO_2$ system materials are comprised of 30 to 95 mol % of $2MgO.SiO_2$, up to 50 mol % of $CaTiO_3$, and up to 60 mol % of $SrTiO_3$ (100 mol % in total), with 0.1 to 10% by weight of MgO and 0.1 to 10% by weight of $La_2O_3$ based on the total of the foregoing oxides added thereto as disclosed in JP-A 21698/1972. The $CaO\text{-}MgO\text{-}TiO_2$ system materials are comprised of 70 to 100 mol % of $MgTiO_3$ and 0 to 30 mol % of $TiO_2$ (100 mol % in total), with 1 to 9% by weight of $CaTiO_3$ based on the total of the foregoing oxides added thereto as disclosed in JP-A 118599/1977. The $BaO\text{-}TiO_2\text{-}SnO_2$ system materials are of the compositional formula: $BaO.x\{(1-y)TiO_2.ySnO_2\}$ wherein x=4 to 4.5 and y is 0 to 0.10 as disclosed in JP-B 32483/1992. The $BaO\text{-}MgO\text{-}CoO\text{-}Nb_2O_5$ system materials are comprised of 56.0 to 63.0% by weight of BaO, 0.1 to 11.7% by weight of CoO, 0.1 to 6.5% by weight of MgO, and 31.0 to 34.7% by weight of $Nb_2O_5$ as disclosed in JP-A 72676/1986. The $BaO\text{-}Nd_2O_3\text{-}TiO_2\text{-}Bi_2O_3\text{-}Al_2O_3\text{-}MnO$ system materials are comprised of 9 to 18 mol % of BaO, 65 to 73 mol % of $TiO_2$, and 14 to 19 mol % of $Nd_2O_3$ (100 mol % in total), with 3.0 to 11.0% by weight of $Bi_2O_3$, 0.1 to 2.0% by weight of $Al_2O_3$ and 0.1 to 1.0% by weight of MnO based on the total of the foregoing oxides added thereto as disclosed in Japanese Patent Application No. 327352/1991 by TDK Corporation.

Also useful are dielectric ceramic materials of $BaO\text{-}MgO\text{-}Ta_2O_5$, $ZrO_2\text{-}SnO_2\text{-}TiO_2$, $PbO\text{-}CaO\text{-}ZrO_2$, $SrO\text{-}ZrO_2\text{-}TiO_2$, $BaO\text{-}Sm_2O_5\text{-}TiO_2$, $PbO\text{-}BaO\text{-}Nd_2O_3\text{-}TiO_2$, and $Li_2O\text{-}Na_2O\text{-}Sm_2O_5\text{-}TiO_2$ systems. The $BaO\text{-}MgO\text{-}Ta_2O_5$ system materials are, for example, of the compositional formula: $Ba_y(Mg_{1-x}Ta_x)O_3$ wherein $0.28 \leq x \leq 0.39$ and $0.98 \leq y \leq 1.00$. The $ZrO_2\text{-}SnO_2\text{-}TiO_2$ system materials are, for example, of the compositional formula: $(Zr_{1-x}Sn_x)TiO_4$ wherein $0.1 \leq x \leq 0.3$. The $PbO\text{-}CaO\text{-}ZrO_2$ system materials are, for example, of the compositional formula: $(Pb_{1-x}Ca_x)ZrO_3$ wherein $0.35 \leq x \leq 0.5$. The $SrO\text{-}ZrO_2\text{-}TiO_2$ system materials are, for example, of the compositional formula: $Sr_y(Zr_{1-x}Ti_x)O_3$ wherein $0 \leq x \leq 0.1$ and $0.98 \leq y \leq 1.01$. The $BaO\text{-}Sm_2O_5\text{-}TiO_2$ system materials are, for example, of the compositional formula: $xBaO\text{-}ySm_2O_5\text{-}zTiO_2$ wherein $0.1 \leq x \leq 0.2$, $0.1 \leq y \leq 0.2$, and $0.6 \leq z \leq 0.75$. The $PbO\text{-}BaO\text{-}Nd_2O_3\text{-}TiO_2$ system materials are, for example, of the compositional formula: $xBaO\text{-}yNd_2O_3\text{-}zTiO_2$ wherein $0.02 \leq x \leq 0.25$, $0.05 \leq y \leq 0.41$, and $0.50 \leq z \leq 0.82$, with up to 17% by weight based on the total of the foregoing oxides of PbO added thereto. The $Li_2O\text{-}Na_2O\text{-}Sm_2O_5\text{-}TiO_2$ system materials are, for example, of the compositional formula: $(Li_xNa_ySm_z)TiO_3$ wherein $x+y+z=1$, $0.25 \leq x \leq 0.35$, $0.15 \leq y \leq 0.25$, and $0.4 \leq z \leq 0.6$.

To the basic compositions mentioned above, there may be added MnO, CuO, ZnO, $SnO_2$, PbO, NiO, $WO_3$, $SiO_2$, $B_2O_5$, $Nb_2O_5$ or the like if necessary.

The dielectric ceramic materials mentioned above have microwave dielectric characteristics as typified by a dielectric constant ($\epsilon$) at 20° C. of 6.5 to 120, especially 20 to 120, a dielectric loss (Q·f value) of 3,500 to 225,000, and a resonance frequency temperature coefficient ($\tau f$) of −4.5 to +8.5 ppm/°C. It is to be noted that τf is the gradient of a straight line connecting the resonance frequency at −40° C. and the resonance frequency at 80° C.

For insulating layers of dielectric ceramic material on which a pattern of internal conductor paste is to be formed according to the present invention, a ceramic material based on an oxide filler as mentioned above is used while glass may be added thereto if desired. The glass which can be added varies with the composition of an oxide filler. One exemplary glass which can be added to the $BaO-Nd_2O_3-TiO_2-Bi_2O_3-Al_2O_3-MnO$ system ceramic material is a glass comprising 20 to 86.5%, especially 30 to 84% by weight of PbO, 8.5 to 21%, especially 9 to 19% by weight of $B_2O_3$, and 5 to 50%, especially 7 to 43% by weight of ZnO. This exemplary glass may further contain $Al_2O_3$ and/or $SiO_2$ in an amount of up to 20%, especially 0.1 to 5% by weight of $Al_2O_3$ and up to 9%, especially 2 to 7% by weight of $SiO_2$.

Such dielectric ceramic material is prepared by adding a vehicle to an oxide filler and optional glass to form a slurry before sintering. Examples of the vehicle used herein include binders such as ethyl cellulose, polyvinyl butyral, methacryl resin and butyl methacrylate, solvents such as terpineol, butyl carbitol, butyl carbitol acetate, acetates, toluene, alcohols and xylene, dispersants, active agents, and plasticizers. Any of these vehicles may be selected in accordance with a particular purpose. The amount of the vehicle added is preferably about 65 to 85% by weight based on the total weight of the oxide filler and glass.

The internal conductor is not critical although it is preferred to use a conductive material capable of forming an internal conductor layer having a DC conductivity of at least $1 \times 10^5 \, \Omega^{-1}\text{cm}^{-1}$. The upper limit of conductivity is generally about $6.2 \times 10^5 \, \Omega^{-1}\text{cm}^{-1}$.

We recommend to use silver having a conductivity of $6.17 \times 10^5 \, \Omega^{-1}\text{cm}^{-1}$ and copper having a conductivity of $5.81 \times 10^5 \, \Omega^{-1}\text{cm}^{-1}$. In a preferred embodiment, silver materials having a melting point of about 960° C. or copper materials having a melting point of about 1060° C. are used. Such materials should preferably have a silver or copper content of at least 90% by weight. Most preferred is pure silver or copper material having a purity of at least 99% by weight, especially at last 99.9% by weight. The use of pure silver or copper enables to minimize the resistivity (which is an inverse of conductivity) and loss, resulting in resonators with improved Q values.

Where silver is used, firing is preferably carried out at a temperature of not lower than 960° C. (the melting point of silver) and not lower than the sintering completion temperature of the ceramic material, generally a temperature of 1150° to 1750° C., especially 1200° to 1700° C. Where copper is used, firing is preferably carried out at a temperature of not lower than 1060° C. (the melting point of copper) and not lower than the sintering completion temperature of the ceramic material, generally a temperature of 1150° to 1750° C., especially 1200° to 1700° C.

Benefits of the invention are obtained when ceramic material layers, typically green sheets and internal conductor layers are co-fired at such a firing temperature. No benefits are obtained if the firing temperature is below the melting point of the internal conductor. The internal conductor can be evaporated and lost if the firing temperature is extremely high. In the case of silver internal conductor, firing is generally carried out in air at the above-defined temperature for about 1 minute to 1 hour, preferably for about 5 to 20 minutes. In the case of copper internal conductor, firing is generally carried out under a controlled oxygen partial pressure of up to $10^{-6}$ atm. Firing may be repeated several times while at least one step of firing should be at or above the melting point of the internal conductor, that is, within the requirement of the invention.

A pattern of internal conductor is formed on dielectric ceramic material by interposing a previously configured silver foil between dielectric green sheets or by printing or transferring a conductor paste to dielectric green sheets. The latter printing method is preferred.

The conductor paste from which an internal conductor pattern is formed is prepared by dispersing a conductor powder in a vehicle. The conductor powder, for example, silver powder and copper powder generally has a mean particle size (or major dimension if anisotropic) of about 0.5 to 20 μm, preferably 1 to 5 μm. With too smaller particle sizes, dispersion is difficult and the content of the conductor powder in the conductor paste cannot be increased or if possible, the resulting paste has a too high viscosity to form a precise pattern. Too larger particle sizes would make it difficult to form patterns by screen printing and transfer methods. No limit is imposed on the shape of silver or copper particles although spherical particles are generally used. Flakes may be used as a partial or entire substitute for the spherical particles.

Preferably the internal conductor paste contains about 60 to 95% by weight, more preferably 70 to 90% by weight of the conductor powder. Smaller conductor contents would lead to a lowering or variation of resistivity and Q value, and partial discontinuity of the conductor pattern after firing. With larger conductor contents, the paste would become too viscous to form a precise pattern.

Glass frit may be added to the internal conductor paste. Preferred is a glass frit having a softening point near the melting point of the conductor powder. Addition of such glass frit minimizes the development of a network structure after melting and suppresses the Q value variation.

The addition of glass frit is also effective for preventing diffusion of the internal conductor material having a relatively small mean particle size. However, since a problem of diffusion is not of concern when a conductor powder having a relatively large particle size is used, it is rather preferred to omit glass frit in such a case. The transmission line loss can be further reduced by omitting glass frit.

Where glass frit is added to the internal conductor paste, its content is preferably up to 10% by weight, more preferably 1 to 10% by weight, most preferably 3 to 8% by weight. Differently stated, the glass frit is preferably contained in an amount of up to 10% by weight, more preferably 2 to 10% by weight, most preferably 4 to 6% by weight, and in an amount of up to 30% by volume, more preferably 2 to 30% by volume, most preferably 5 to 10% by volume, both based on the conductor powder.

In the internal conductor paste, the vehicle is contained as well as the conductor powder (e.g., silver and copper powder) and optional glass frit. Examples of the vehicle used herein include binders such as ethyl cellulose, polyvinyl butyral, methacryl resin and butyl methacrylate, solvents such as terpineol, butyl carbitol, butyl carbitol acetate, toluene, alcohols and xylene, dispersants, active agents, and plasticizers. Any of these vehicles may be selected in accordance with a particular purpose. The amount of the vehicle added is preferably about 10 to 20% by weight based on the weight of the paste.

The internal conductor paste is applied to form a pattern by any of well-known screen printing and transfer methods.

Although the internal conductor may consist solely of such an internal conductor material, it is possible that the internal conductor be made of two or more conductor materials having different melting points. For example, a low melting internal conductor is combined with a high melting internal conductor in a preferred embodiment. In such a case firing is done at a temperature which is not lower than the melting point of a low melting internal conductor, lower than the melting point of a high melting internal conductor, and not lower than the sintering completion temperature of the ceramic material.

The lower melting internal conductor used herein is preferably silver or copper as previously described, with equivalent benefits being obtained.

The conductor used as the high melting internal conductor may be a conductor which has a higher melting point than the conductor used as the low melting internal conductor. It is to be noted that since firing is carried out at a temperature intermediate the melting points of the low and high melting internal conductors, the conductor used as the high melting internal conductor should preferably have a melting point which is at least 30° C., more preferably 50° to 200° C., most preferably 50° to 100° C. higher than the melting point of the low melting internal conductor in order that both the conductors be effectively fired. It is possible to use a mixture of two metal powders such as Ag and Pd powders as the high melting internal conductor as will be described later, the mixture being alloyed upon firing without melting Ag. In such a case, the melting point is that of the alloy.

The preferred conductor used as the high melting internal conductor is an Ag-Pd alloy containing up to 30% by weight, especially 5 to 10% by weight of Pd where silver is used as the low melting internal conductor. Instead of the alloy, a mixture of Ag and Pd powders may also be used. As long as Ag and Pd powders are uniformly dispersed, firing initially induces alloying between Ag and Pd while the silver is not melted. Additionally, for silver, there may be used Ag-Au alloys containing up to 100% by weight, especially 50 to 60% by weight of Au; Ag-Pt alloys containing up to 20% by weight, especially 5 to 10% by weight of Pt; Au-Pd alloys containing up to 20% by weight, especially 5 to 20% by weight of Pd; Au-Pt alloys containing up to 10% by weight, especially 5 to 10% by weight of Pt; gold; copper; Au-Cu alloys containing up to 25% by weight of Au; Au-Cu alloys containing up to 20% by weight of Cu; Cu-Pt alloys containing up to 10% by weight, especially up to 5% by weight of Pt; Cu-Ni alloys containing up to 25% by weight, especially up to 10% by weight of Ni, etc. Where copper is used as the low melting internal conductor, there may be used Ag-Pt alloys containing 7 to 30% by weight, especially 10 to 20% by weight of Pt; Au-Pd alloys containing 2 to 20% by weight, especially 2 to 10% by weight of Pd; An-Pt alloys containing 2 to 20% by weight, especially 2 to 10% by weight of Pt; Cu-Pt alloys containing up to 30% by weight, especially 15 to 20% by weight of Pt; Cu-Ni alloys containing up to 40% by weight, especially 20 to 30% by weight of Ni, etc.

It is to be noted that two or more high melting internal conductors may be used and in some cases, two or more low melting internal conductors may be used. Further, a component of the high melting internal conductor may be partially melted. It is appreciated that substantially all of the low melting internal conductor should be melted.

For the detail of the internal conductor material which is subject to co-firing together with ceramic material at or above the melting point of the internal conductor material, reference is made to Japanese Patent Application Nos. 134199/1992 and 146478/1992 by TDK Corporation.

Depending on the ceramic material and/or conductor material used, firing is carried out in an atmosphere having an oxygen partial pressure lower than that in the ambient air. For a combination of silver used as the conductor material and a ceramic material having added thereto glass as mentioned above, firing is preferably carried out in an atmosphere having an oxygen partial pressure of up to $5\times10^{-2}$ atm. because it becomes possible to reduce the thickness of silver layers, prevent loss of silver, and increase the Q value of resonators. In order that a glass component in the ceramic material be sintered, the lower limit of oxygen partial pressure is $5\times10^{-5}$ atm.

Particularly when silver is used as the internal conductor material, the oxygen partial pressure during firing should preferably be up to $1\times10^{-1}$ atm., more preferably up to $5\times10^{-2}$ atm., most preferably up to $1\times10^{-2}$ atm. It is known for silver as internal conductor material that when alternately stacked layers of internal conductor material and dielectric ceramic material are fired, silver is melted while it forms a solid solution with oxygen from the ambient atmosphere. The oxygen in solid solution with silver is released as oxygen gas upon cooling and solidification of molten silver. This oxygen gas release can cause to increase the internal pressure between the internal conductor layer and the adjacent dielectric ceramic layer.

If the adjacent dielectric ceramic layer is thick and thus has relatively high mechanical strength, a substantial problem occurs rarely. However, an increased internal pressure due to the release of oxygen gas can sometimes form gaps between the internal conductor and the dielectric ceramic material layer, resulting in a resonator with a low Q value.

In one embodiment of the multilayer ceramic part comprising alternately stacked layers of dielectric ceramic material and internal conductor, the part as fired has a layer of dielectric ceramic material as the outermost layer when viewed in the direction of stacking. In this structure, if the distance from the surface of the internal conductor layer located on the outermost layer side to the outer surface of the outermost layer (designated at t or t' in FIG. 4) is up to 500 μm, particularly up to 300 μm, especially up to 200 μm, an increase of the internal pressure between the internal conductor layer and the adjacent dielectric ceramic layer due to the release of oxygen gas can cause an accident that separation occur between these adjacent layers. It will be understood that the dielectric ceramic layer, which is the outermost layer as viewed in the stacking direction, where such a separation accident can occur is located at two positions, the top and bottom in the stacking direction. A separation accident tends to occur when the distance from the surface of the outermost internal conductor layer located on the outermost layer side to the outer surface of one of the two outermost dielectric ceramic layers is 500 μm or less. Usually the dielectric ceramic layers have a thickness of at least 40 μm.

Under this situation, the oxygen partial pressure during sintering is preferably controlled to $1\times10^{-1}$ atm. or lower, more preferably $5\times10^{-2}$ atm. or lower, most preferably $1\times10^{-2}$ atm. or lower. Differently stated, as the thickness of the dielectric ceramic layer located at the outermost side in the stacking direction during firing is reduced, there is an increasing possibility that the release of oxygen gas upon cooling and solidification of silver conductor increase the internal pressure between the internal conductor layer and the dielectric ceramic layer to cause separation therebetween. Then it is preferred to use a lower oxygen partial pressure during firing as the dielectric ceramic layer is reduced in thickness.

Although lowering the oxygen partial pressure during firing is generally preferred, some of the above-mentioned dielectric ceramic materials tend to be chemically reduced when the oxygen partial pressure during firing is lower than $1\times10^{-4}$ atm. Such ceramic materials reducible at a lower oxygen partial pressure during firing are those of $CaO-MgO-TiO_2$, $BaO-TiO_2-SnO_2$, $BaO-Nd_2O_3-TiO_2-Bi_2O_3-Al_2O_3-MnO$, $ZrO_2-SnO_2-TiO_2$, $SrO-ZrO_2-TiO_2$, $BaO-Sm_2O_5-TiO_2$, $PbO-BaO-Nd_2O_3-TiO_2$, and $Li_2O-Na_2O-Sm_2O_5-TiO_2$ systems. If dielectric ceramic materials are reduced, resonators and other parts fabricated therefrom would have a very low Q value. Then multilayer ceramic parts which are fabricated from dielectric ceramic materials of the above-exemplified systems and have the structure wherein the distance from the surface of the internal conductor layer located on the outermost layer side to the outer surface of the outermost dielectric ceramic layer is up to 500 μm during firing should preferably be fired under an oxygen partial pressure of from more than $1\times10^{-4}$ atm. to $1\times10^{-1}$ atm., more preferably from $5\times10^{-2}$ atom. to $1\times10^{-3}$ atm., most preferably from $1\times10^{-2}$ atm. to $1\times10^{-3}$ atm.

Where copper is used as the conductive material, firing is generally carried out under a controlled oxygen partial pressure of $1\times10^{-6}$ atm. or lower as previously described. Copper can be oxidized at a higher oxygen partial pressure so that the internal electrode may disappear.

As mentioned above, some dielectric ceramic materials can be reduced when the oxygen partial pressure during firing is lower. Then where copper is used as the internal conductor, it is preferred to use those ceramic materials which are least reducible at a lower oxygen partial pressure. Such least reducible materials are of $MgO-SiO_2$, $BaO-MgO-CoO-Nb_2O_5$, and $PbO-CaO-ZrO_2$ systems.

The multilayer ceramic parts of the present invention provide a high Q value when designed as resonators. For example, a Q value of about 280 to 430 is available when the dielectric material is 3 mm thick.

Referring to FIG. 2, there is illustrated in perspective view a layered filter as one embodiment of the multilayer ceramic part of the present invention. The filter generally designated at 1 in FIG. 2 is a two-stage filter including a pair of blocks 11 of a dielectric ceramic material, outer internal conductors 21 and 23 extending through the blocks 11, and a central internal conductor 22 interposed between the blocks 11.

Figure 3:
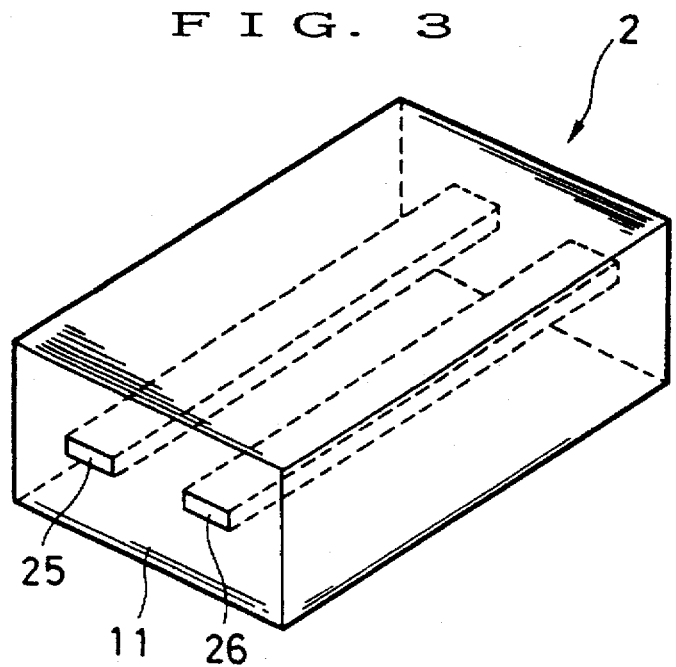
FIG. 3 is a schematic view showing the structure of a multilayer filter according to another embodiment of the invention.

FIG. 3 illustrated another structure. This layered filter 2 includes a block 11 of a dielectric ceramic material and a pair of parallel internal conductors 25 and 26 extending through the block 11.

In either of the filters of FIGS. 2 and 3, the outer surface is covered with a metal or insulator though not shown.

FIG. 4 illustrates a still further structure. This layered filter 3 includes a plurality of stacked layers of dielectric ceramic material, outer internal conductor layers 27 and 29 and a central internal conductor layer 28 interposed between ceramic layers. The filter has top and bottom dielectric ceramic layers as the outermost layers when viewed in the stacking direction, the top and bottom dielectric ceramic layers having a thickness t and t'. The internal conductor layers 27 and 29 are spaced from the surface of the outermost layer a distance of 500 μm or less. Where at least one of the thicknesses t and t' of the outermost dielectric ceramic layers is 500 μm or less after firing and the internal conductor layers 27 and 29 are of silver, there is a tendency that the outermost dielectric ceramic layers separate from the internal conductor layers 27 and 29. It will be understood that the filter of FIG. 4 need not be provided with an external electrode on the outer surface because the internal conductor layers 27 and 29 function as a shield layer.

The layered filter of a structure as mentioned above is fabricated by first forming green sheets by a doctor blade technique or the like using a slurry of a calcined powder of dielectric ceramic material in a binder, and printing a predetermined pattern of conductor on the sheets by a screen printing technique or the like using a paste of internal conductor. The printed sheets are stacked, pressed for thermo-compression bonding by means of a heat press, removed of the binder, and then fired at a temperature equal to or above the melting point of the internal conductor and equal to or above the sintering completion temperature of the ceramic material. Thereafter, if necessary, an external electrode paste is printed and baked to form an external electrode. Alternatively, a printing lamination method may be used.

In the thus fabricated multilayer filters, the dielectric material has an overall thickness of about 0.5 to 4 mm. Each of the internal conductor layers has a thickness of about 20 to 100 μm and a width of about 0.5 to 2 mm. Benefits of the invention are doubled when the internal conductor layer has a thickness of less than 50 μm, especially less than 40 μm. Each of the dielectric ceramic layers has a thickness of about 40 to 150 μm. The multilayer ceramic parts of the present invention are generally operated at a frequency in the range of at least 200 MHz, especially from 800 MHz to 10 GHz.

EXAMPLE

Examples of the present invention are given below by way of illustration and not by way of limitation.

Example 1

Resonators were fabricated. A raw material designed to provide an oxide dielectric ceramic material of the composition shown in Table 1 was calcined, milled, and dispersed in a binder to provide a slurry, from which green sheets of 150 to 200 μm thick were formed by a doctor blade technique. A silver conductor paste was applied to the green sheets by a screen printing technique. The printed sheets were stacked, heat pressed for bonding, removed of the binder, and fired under the conditions shown in Table 1. An external electrode paste was printed and baked to form an external electrode. The products were ¼λ resonators which had the same structure as shown in FIG. 2, but of a single stage. They are designated Samples A to I. It is to be noted that λ is a wavelength in the dielectric material and ¼λ is a quarter of the wavelength λ.

In these ¼λ resonators, the number of dielectric ceramic sheets stacked was 20, the internal conductor layer had a thickness of 60 μm and a width of 2 mm, the dielectric material had a total thickness of 3.0 mm. The overall dimensions were ¼λ×5 mm×3.0 mm.

The silver conductor paste used herein was obtained by mixing and dispersing the following components in a three-roll mill. Reported in Table 1 are the melting point and conductivity of silver.

| | |
|---|---|
| Silver powder (mean particle size 3 μm, purity ≧ 99.9%) | 90 wt % |
| Acrylic resin (binder) | 2.5 wt % |
| Terpineol (solvent) | 7.5 wt % |

The ¼λ resonators were evaluated for filter performance using a YHP 8510 network analyzer, determining a Q value as a resonator.

Note that green sheets of dielectric ceramic material were prepared in accordance with the methods disclosed in JP-A 21698/1977, 118599/1977, and 72676/1986, JP-B 32483/1992, and Japanese Patent Application No. 327352/1991 (by TDK Corporation). The calcining conditions are shown in Table 2.

Instead of green sheets, column sample Nos. 1 to 8 were prepared by molding the same dielectric ceramic materials into cylindrical columns and firing under the conditions shown in Table 2. These column samples were worked to 10 mm in diameter×5 mm and measured for dielectric constant (s) and dielectric loss (Q·f value) by a dielectric resonance method. A resonance frequency temperature coefficient ($\tau f$) was calculated from the gradient of a straight line connecting the resonance frequency at −40° C. and the resonance frequency at 80° C. The results are shown in Table 2.

Each of the dielectric ceramic materials was heated at a rate of 200° C./hour to draw a thermal contraction curve from which the sintering initiation temperature (°C.) and sintering completion temperature (°C.) were determined. The results are shown in Table 3.

TABLE 1

| Sample | Dielectric ceramic material composition | Conductor material Metal | MP | Conductivity ($\Omega^{-1}cm^{-1}$) | Firing conditions Temp. | Time | Atmosphere | Resonator property, Q value | Dielectric block thickness |
|---|---|---|---|---|---|---|---|---|---|
| A | $2MgO \cdot SiO_2$—$CaTiO_3$—$SrTiO_3$ (90 mol %)(2 mol %)(8 mol %) —MgO—$La_2O_3$ (1.5 wt %)(1.5 wt %) | Ag | 960° C. | $6.17 \times 10^5$ | 1230° C. | 10 min. | air | 338 | 3 mm |
| B | $MgTiO_3$—$TiO_2$—$CaTiO_3$ (90 mol %)(10 mol %)(6.2 wt %) | Ag | 960° C. | $6.17 \times 10^5$ | 1380° C. | 10 min. | air | 418 | 3 mm |
| C | BaO—CoO—MgO—$Nb_2O_5$ (58.8 wt %)(4.8 wt %)(2.6 wt %)(33.8 wt %) | Ag | 960° C. | $6.17 \times 10^5$ | 1470° C. | 10 min. | air | 390 | 3 mm |
| D | $BaO \cdot x[(1-y)TiO_2 \cdot ySnO_2]$ (x = 4.4, y = 0.09) | Ag | 960° C. | $6.17 \times 10^5$ | 1360° C. | 10 min. | air | 316 | 3 mm |
| E | BaO—$TiO_2$—$Nd_2O_3$ (14.7 mol %)(70.0 mol %)(15.3 mol %) —$Bi_2O_3$—$Al_2O_3$—MnO (7.5 wt %)(1.0 wt %)(0.1 wt %) | Ag | 960° C. | $6.17 \times 10^5$ | 1320° C. | 10 min. | air | 322 | 3 mm |
| F | $BaO \cdot x[(1-y)TiO_2 \cdot ySnO_2]$ (x = 4.4, y = 0.09) | Ag | 960° C. | $6.17 \times 10^5$ | 1360° C. | 10 min. | $1 \times 10^{-3}$ atm. ($PO_2$) | 368 | 3 mm |
| G | $Ba(Mg_{1/3}Ta_{2/3})O_3$ | Ag | 960° C. | $6.17 \times 10^5$ | 1670° C. | 10 min. | air | 420 | 3 mm |
| H | $(Zr_{0.8}Sn_{0.2})TiO4$ | Ag | 960° C. | $6.17 \times 10^5$ | 1600° C. | 10 min. | air | 388 | 3 mm |
| I | $(Pb_{0.63}Ca_{0.37})ZrO3$ | Ag | 960° C. | $6.17 \times 10^5$ | 1450° C. | 10 min. | air | 300 | 3 mm |

TABLE 2

| Sample No. | Dielectric ceramic material composition | Calcining conditions Temp. (°C.) | Time | Firing conditions Temp. (°C.) | Time | $\epsilon$ | Q·f (GHz) | $\tau f$ (ppm/°C.) |
|---|---|---|---|---|---|---|---|---|
| 1 | $2MgO \cdot SiO_2$—$CaTiO_3$—$SrTiO_3$ (90 mol %)(2 mol %)(8 mol %) —MgO—$La_2O_3$ (1.5 wt %)(1.5 wt %) | 1000 | 2 hr. | 1230 | 10 min. | 7 | 13000 | 0 |
| 2 | $MgTiO_3$—$TiO_2$—$CaTiO_3$ (90 mol %)(10 mol %)(6.2 wt %) | 1100 | 3 hr. | 1380 | 10 min. | 20 | 40500 | 0 |
| 3 | BaO—CoO—MgO—$Nb_2O_5$ (58.8 wt %)(4.8 wt %)(2.6 wt %)(33.8 wt %) | 1200 | 2 hr. | 1470 | 10 min. | 33 | 70000 | −4.0 |
| 4 | $BaO \cdot x[(1-y)TiO_2 \cdot ySnO_2]$ (x = 4.4, y = 0.09) | 1100 | 2 hr. | 1360 | 10 min. | 37 | 35000 | +4.0 |
| 5 | BaO—$TiO_2$—$Nd_2O_3$ | 1200 | 2 hr. | 1320 | 10 min. | 93 | 4000 | +8.0 |

TABLE 2-continued

| Sample No. | Dielectric ceramic material composition | Calcining conditions Temp. (°C.) | Time | Firing conditions Temp. (°C.) | Time | ε | Q · f (GHz) | τf (ppm/°C.) |
|---|---|---|---|---|---|---|---|---|
| | (14.7 mol %)(70.0 mol %)(15.3 mol %) —Bi$_2$O$_3$—Al$_2$O$_3$—MnO (7.5 wt %)(1.0 wt %)(0.1 wt %) | | | | | | | |
| 6 | Ba(Mg$_{1/3}$Ta$_{2/3}$)O$_3$ | 1300 | 2 hr. | 1670 | 10 min. | 21 | 220000 | +4.0 |
| 7 | (Zr$_{0.8}$Sn$_{0.2}$)TiO4 | 1200 | 2 hr. | 1600 | 10 min. | 38 | 55000 | 0 |
| 8 | (Pb$_{0.63}$Ca$_{0.37}$)ZrO3 | 1000 | 2 hr. | 1450 | 10 min. | 110 | 3300 | +13 |

TABLE 3

| Sample No. | Dielectric ceramic material composition | Sintering completion temperature | Sintering initiation temperature |
|---|---|---|---|
| | | (Heating rate: 200° C./hr.) | |
| 1 | 2MgO.SiO$_2$—CaTiO$_3$—SrTiO$_3$ (90 mol %)(2 mol %)(8 mol %) —MgO—La$_2$O$_3$ (1.5 wt %)(1.5 wt %) | 1226° C. | 1141° C. |
| 2 | MgTiO$_3$—TiO$_2$—CaTiO$_3$ (90 mol %)(10 mol %)(6.2 wt %) | 1357° C. | 1179° C. |
| 3 | BaO—CoO—MgO—Nb$_2$O$_5$ (58.8 wt %)(4.8 wt %)(2.6 wt %)(33.8 wt %) | 1468° C. | 1306° C. |
| 4 | BaO.x[(1 − y)TiO$_2$.ySnO$_2$] (x = 4.4, y = 0.09) | 1307° C. | 1172° C. |
| 5 | BaO—TiO$_2$—Nd$_2$O$_3$ (14.7 mol %)(70.0 mol %)(15.3 mol %) —Bi$_2$O$_3$—Al$_2$O$_3$—MnO (7.5 wt %)(1.0 wt %)(0.1 wt %) | 1282° C. | 1154° C. |
| 6 | Ba(Mg$_{1/3}$Ta$_{2/3}$)O$_3$ | 1652° C. | 1523° C. |
| 7 | (Zr$_{0.8}$Sn$_{0.2}$)TiO4 | 1580° C. | 1445° C. |
| 8 | (Pb$_{0.63}$Ca$_{0.37}$)ZrO3 | 1427° C. | 1281° C. |

As is evident from Table 1, the ¼λ resonators within the scope of the invention have high Q values. It was believed in the prior art (see JP-A 290358/1991) that in co-firing a dielectric ceramic material and a conductor material to form a layered filter, firing should be done at a temperature which does not cause the internal conductor material to melt and the use of high-temperature sintering ceramic material as used in this example should be avoided. The results of this example are quite unexpected from the previous belief.

For comparison purposes, a ¼λ resonator was fabricated by the same procedure as above except that the low-temperature sintering ceramic material disclosed in Example 6 of JP-A 295856/1991 (which probably has a sintering completion temperature of lower than 925° C. at a heating rate of 200° C./hour) was used. This comparative resonator had a Q value apparently lower than those of the inventive samples.

Example 2

Resonators of the structure shown in FIG. 4 were fabricated by using the dielectric ceramic material compositions of Samples E, H and I in Table 1 and firing under the same conditions as in Example 1. The oxygen partial pressure (Po$_2$) was changed as shown in Table 4. The dielectric ceramic layers as the outermost layers when viewed in the stacking direction in FIG. 4 had a thickness of t, t' of 200 μm as fired. There were fabricated sample Nos. 21–24, 31–34, and 41–46.

Similarly, sample Nos. 25 and 26 were fabricated by the same procedure as above except that the firing atmosphere or oxygen partial pressure was as shown in Table 4 and the dielectric ceramic layers as the outermost layers had a thickness of t, t' of 400 μm as fired.

The fired samples were examined whether or not the dielectric ceramic layer located as the outermost layer when viewed in the stacking direction separated from the adjacent internal conductor layer. The results are shown in Table 4.

From those samples in which no separation was found, ¼λ resonators were fabricated. The number of ceramic layers stacked was 20 layers between the internal conductor layers 27 and 29. The central internal conductor layer 28 was 60 μm thick and 2 mm wide. The dielectric material forming the resonator was 3.0 mm thick as in Table 1. The overall dimensions of the resonator were ¼λ×5 mm×3.0 mm.

These resonators were measured for filter performance as in Example 1. The results are shown in Table 4. With respect to those fired-in-air samples in which separation was found (Nos. 21, 25, 31, and 41), the data of resonator Q value reported in Table 4 are mere reproductions of the values of the same dielectric ceramic materials reported in Table 1.

TABLE 4

| Sample No. | Dielectric ceramic material composition | Internal conductor metal | Firing atmosphere or $PO_2$ (atm.) | Separation between internal conductor and dielectric ceramic layer | Resonator property, Q value | Outermost ceramic layer thickness t (μm) |
|---|---|---|---|---|---|---|
| 21 (comparison) | BaO—$TiO_2$—$Nd_2O_3$—$Bi_2O_3$—$Al_2O_3$—MnO (14.7 mol %)(70 mol %)(15.3 mol %)(7.5 wt %)(1.0 wt %)(0.1 wt %) | Ag | air | separated | 322 | 200 |
| 22 | BaO—$TiO_2$—$Nd_2O_3$—$Bi_2O_3$—$Al_2O_3$—MnO (14.7 mol %)(70 mol %)(15.3 mol %)(7.5 wt %)(1.0 wt %)(0.1 wt %) | Ag | $1 \times 10^{-2}$ | NO | 320 | 200 |
| 23 | BaO—$TiO_2$—$Nd_2O_3$—$Bi_2O_3$—$Al_2O_3$—MnO (14.7 mol %)(70 mol %)(15.3 mol %)(7.5 wt %)(1.0 wt %)(0.1 wt %) | Ag | $1 \times 10^{-3}$ | NO | 306 | 200 |
| 24 (comparison) | BaO—$TiO_2$—$Nd_2O_3$—$Bi_2O_3$—$Al_2O_3$—MnO (14.7 mol %)(70 mol %)(15.3 mol %)(7.5 wt %)(1.0 wt %)(0.1 wt %) | Ag | $1 \times 10^{-4}$ | NO | 161 | 200 |
| 25 (comparison) | BaO—$TiO_2$—$Nd_2O_3$—$Bi_2O_3$—$Al_2O_3$—MnO (14.7 mol %)(70 mol %)(15.3 mol %)(7.5 wt %)(1.0 wt %)(0.1 wt %) | Ag | air | separated | 322 | 400 |
| 26 | BaO—$TiO_2$—$Nd_2O_3$—$Bi_2O_3$—$Al_2O_3$—MnO (14.7 mol %)(70 mol %)(15.3 mol %)(7.5 wt %)(1.0 wt %)(0.1 wt %) | Ag | $1 \times 10^{-2}$ | NO | 318 | 400 |
| 31 (comparison) | $(Zr_{0.8}Sn_{0.2})TiO_4$ | Ag | air | separated | 338 | 200 |
| 32 | $(Zr_{0.8}Sn_{0.2})TiO_4$ | Ag | $1 \times 10^{-2}$ | NO | 384 | 200 |
| 33 | $(Zr_{0.8}Sn_{0.2})TiO_4$ | Ag | $1 \times 10^{-3}$ | NO | 352 | 200 |
| 34 (comparison) | $(Zr_{0.8}Sn_{0.2})TiO_4$ | Ag | $1 \times 10^{-4}$ | NO | 140 | 200 |
| 41 (comparison) | $(Pb_{0.63}Ca_{0.37})ZrO_3$ | Ag | air | separated | 300 | 200 |
| 42 | $(Pb_{0.63}Ca_{0.37})ZrO_3$ | Ag | $1 \times 10^{-2}$ | NO | 310 | 200 |
| 43 | $(Pb_{0.63}Ca_{0.37})ZrO_3$ | Ag | $1 \times 10^{-3}$ | NO | 298 | 200 |
| 44 | $(Pb_{0.63}Ca_{0.37})ZrO_3$ | Ag | $1 \times 10^{-4}$ | NO | 292 | 200 |
| 45 | $(Pb_{0.63}Ca_{0.37})ZrO_3$ | Ag | $1 \times 10^{-5}$ | NO | 288 | 200 |
| 46 | $(Pb_{0.63}Ca_{0.37})ZrO_3$ | Ag | $1 \times 10^{-6}$ | NO | 281 | 200 |

As is evident from Table 4, no separation occurs between the dielectric ceramic layer and the internal conductor layer as long as the oxygen partial pressure in the firing atmosphere is within the preferred range of the present invention. Separation occurs when the firing atmosphere is the ambient air. When the oxygen partial pressure in the firing atmosphere is as low as $1 \times 10^{-4}$ atm., those resonators using Samples E and H as the dielectric ceramic material perform poorly. In contrast, the resonator using Sample I as the dielectric ceramic material does not experience a drop of performance even when the oxygen partial pressure in the firing atmosphere is as low as $1 \times 10^{-6}$ atm.

All the dielectric ceramic materials in the scope of the invention had a sintering completion temperature $T_{20}$ which was above Ag's melting point+150° C. It was found that $T_{20}'$ was above Ag's melting point+50° C. Note that the temperature $T_{20}'$ (point G in FIG. 1) corresponds to 80% from point C in the distance between the sintering initiation temperature (point C in FIG. 1) and the sintering completion temperature $T_{20}$ (point F in FIG. 1) as determined from the thermal contraction curve (FIG. 1).

Example 3

Using the dielectric ceramic material compositions of Samples A, D and E in Table 1, green sheets were prepared as in Example 1. The same silver conductor paste as in Example 1 was applied to the green sheets to form a pattern of linear strips by a screen printing method. On each printed sheet, a green sheet of the corresponding dielectric ceramic material was placed and thermally bonded under pressure. After binder removal, each laminate was fired under the same firing conditions as in Table 1 except that the firing atmosphere had an oxygen partial pressure of $1 \times 10^{-2}$ atm.

The fired products were dimensioned 56 mm long, 65 mm wide, and 400 μm thick. The silver conductor layer had a pattern of equally spaced 24 linear strips extending in a longitudinal direction of the fired product. The pattern was printed such that each strip was dimensioned about 46 mm long, about 1 mm wide, and about 40 μm thick after firing. The conductor pattern was printed where no conductor was exposed outside after lamination.

Each of the fired products (10 specimens for each dielectric ceramic material composition) was rested on a transparent glass plate below which a visible light source was placed. Visible light was irradiated to the fired product from below the glass plate to visually observe the transmitted light. The fired product was also analyzed by taking a transmission X-ray image. In this way, it was examined whether or not the silver conductor pattern was broken. For each dielectric ceramic material composition, the number of broken portions was about 5 to 10 in a fired product.

Comparative Example 1

Green sheets were prepared by using aluminum nitride powder having a mean particle size of about 1 μm as a dielectric ceramic material and calcium carbonate as a sintering aid in an amount of 0.5% by weight calculated as CaO, mixing them with a binder to form a slurry, and casting the slurry. As in Example 3, the silver conductor paste was applied to the green sheets to form a pattern of linear strips. Another green sheet was placed on the printed sheet and thermally bonded under pressure. After binder removal, the laminate was fired in a nitrogen gas atmosphere at 1600° C. for 10 minutes. The dimensions of the fired product and conductor pattern and the location of the printed conductor pattern were the same as in Example 3.

Ten specimens of the fired product were examined as in Example 3 whether or not the silver conductor pattern was broken. The number of broken portions was about 40 to 50 in a fired product. Additionally there were observed many conductor strip portions which were narrowed in width though not broken.

As seen from Example 3 and Comparative Example 1, the use of an oxide or a mixture of oxides as a dielectric ceramic material contributes to a substantial reduction of the occurrence of a conductor breakage accident as compared with the use of aluminum nitride having poor wettability to molten metal (silver).

Example 4

Resonators were fabricated by the same procedure as in Example 1 except that copper was used as the internal conductor material, Samples A, C and I in Table 1 were used as the dielectric ceramic material, and the firing atmosphere had an oxygen partial pressure of $1\times10^{-6}$ atm.

The copper conductor paste used herein was obtained by mixing and dispersing the following components in a three-roll mill.

| | |
|---|---|
| Copper powder (mean particle size 5 μm, purity ≥ 99.9%) | 90 wt % |
| Acrylic resin (binder) | 2.5 wt % |
| Terpineol (solvent) | 7.5 wt % |

The resonators showed excellent performance (Q value).

ADVANTAGES

There has been described a multilayer ceramic part comprising dielectric ceramic layers and internal conductor layers therebetween wherein the dielectric ceramic layers are made from an oxide system dielectric ceramic material having a specific sintering completion temperature, a pattern of internal conductor is applied to the dielectric ceramic layers, and the laminate is fired at or above the melting point of the internal conductor. Then the internal conductor is densified and improved in surface property. The dielectric ceramic material used has excellent dielectric properties including a dielectric constant and a dielectric loss (Q·f). The part exhibits improved properties, for example, an increased Q value when the part is a resonator. The invention minimizes the occurrence of defective parts in which the internal conductor layer is separated from the dielectric ceramic layer or the internal conductor layer is broken.

Although some preferred embodiments have been described, many modifications and variations may be made thereto in the light of the above teachings. It is therefore to be understood that within the scope of the appended claims, the invention may be practiced otherwise than as specifically described.

We claim:

1. A multilayer ceramic part suitable for microwave operation comprising a plurality of dielectric ceramic layers and at least one internal conductor layer interposed therebetween, said part being prepared by a method comprising the steps of:

forming dielectric ceramic layers from an oxide system dielectric ceramic material having a sintering completion temperature as determined from a thermal contraction curve at a heating rate of 200° C./hour which is between the melting point and the boiling point of the internal conductor, forming a pattern of internal conductor comprising silver on one of the dielectric ceramic layers, placing another of the dielectric ceramic layers on said one dielectric ceramic layer to form a laminate, and firing the laminate at a temperature equal to or above the melting point of silver and at or above said sintering completion temperature in an atmosphere having an oxygen partial pressure of $5\times10^{-5}$ atm. to that of air.

2. A multilayer ceramic part according to claim 1 wherein said dielectric ceramic material has a dielectric constant of 6.5 to 120 at 20° C.

3. A multilayer ceramic part according to claim 1 wherein said internal conductor contains at least 90% by weight of silver or copper.

4. A multilayer ceramic part according to any one of claims 2 and 3 wherein said internal conductor is formed of silver and the laminate is fired in an atmosphere having an oxygen partial pressure of up to $1\times10^{-1}$ atm.

5. A multilayer ceramic part according to claim 4 wherein one of the dielectric ceramic layers is the outermost layer of the part, and the distance from the surface of the internal conductor layer facing the outermost layer side to the outer surface of the outermost dielectric ceramic layer is up to 500 μm.

6. A multilayer ceramic part according to claim 1, wherein said dielectric material is selected from the group consisting of Mg-$SiO_2$ comprised of 30 to 95 mol % of 2 $MgO.SiO_2$, up to 50 mol % of $CaTiO_3$, and up to 60 mol % of $SrTiO_3$, with 0.1 to 10% by weight of MgO and 0.1 to 10 by weight of $La_2O_3$; CaO-MgO-$TiO_2$ comprised of 70–100 mol %, $MgTiO_3$ and 0–30 mol % of $TiO_2$, with 1 to 9% by weight of $CaTiO_3$; BaO-$TiO_2$-$SnO_2$ of the compositional formula: $BaO_x((1-y)TiO_2.ySnO_2)$, wherein x=4 to 4.5 and y is 0 to 0.10; BaO-MgO-CoO-$Nb_2O_5$ comprised of 56.0 to 63.0% by weight of BaO, 0.1 to 11.7% by weight of CoO, 0.1 to 6.5% by weight of MgO, and 31.0 to 34.7% by weight of $Nb_2O_5$; BaO-$Nd_2O_3$-$TiO_2$-$Bi_2O_3$-$Al_2O_3$-MnO comprised of 9 to 18 mol % of BaO, 65 to 73 mol % of $TiO_2$, and 14 to 19 mol % of $Nd_2O_3$ with 3.0 to 11.0% by weight of $Bi_2O_3$, 0.1 to 2.0% by weight of $Al_2O_3$ and 0.1 to 1.0% by weight of MnO; BaO-MgO-$Ta_2O_5$ of the compositional formula: $Ba_y(Mg_{1-x}Ta_x)O_3$ wherein $0.28 \leq x \leq 0.39$ and $0.98 \leq y \leq 1.00$; $ZrO_2$-$SnO_2$-$TiO_2$ of the compositional formula: $(Zr_{1-x}Sn_x)TiO_4$ wherein $0.1 \leq x \leq 0.3$; PbO-CaO-$ZrO_2$ of the compositional formula: $(Pb_{1-x}Ca_x)ZrO_3$ wherein $0.35 \leq x \leq 0.5$; SrO-$ZrO_2$-$TiO_2$ of the compositional formula: $Sr_y(Zr_{1-x}Ti_x)O_3$ wherein $0 \leq x \leq 0.1$ and $0.98 \leq y \leq 1.01$; BaO-$Sm_2O_5$-$TiO_2$ of the compositional formula: $xBaO-ySm_2O_5-zTiO_2$ wherein $0.1 \leq x \leq 0.2$, $0.1 \leq y \leq 0.2$, and $0.6 \leq z \leq 0.75$; PbO-BaO-$Nd_2O_3$-$TiO_2$ of the compositional formula: $xBaO-yNd_2O_3-zTiO_2$ wherein $0.02 \leq x \leq 0.25$, $0.05 \leq y \leq 0.41$, and $0.50 \leq z \leq 0.82$, with up to 17% by weight based on the total of the foregoing oxides of PbO added thereto; and $Li_2O$-$Na_2O$-$Sm_2O_5$-$TiO_2$ of the compositional formula: $(Li_xNa_ySm_z)TiO_3$ wherein $x+y+z=1$, $0.25 \leq x \leq 0.35$, $0.15 \leq y \leq 0.25$, and $0.4 \leq z \leq 0.6$.

7. A multilayer ceramic part according to claim 5, wherein said dielectric ceramic material is selected from the group consisting of CaO-MgO-$TiO_2$ comprised of 70 to 100 mol % of $MgTiO_3$ and 0 to 30 mol % of $TiO_2$ with 1 to 9% by weight of $CaTiO_3$; BaO-$TiO_2$-$SnO_2$ of the compositional formula: BaO.x{(1-y)$TiO_2$.y$SnO_2$} wherein x=4 to 4.5 and y is 0 to 0.10; BaO-MgO-CoO-$Nb_2O_5$ comprised of 56.0 to 63.0% by weight of BaO, 0.1 to 11.7% by weight of CoO, 0.1 to 6.5% by weight of MgO, and 31.0 to 34.7% by weight of $Nb_2O_5$; BaO-$Nd_2O_3$-$TiO_2$-$Bi_2O_3$-$Al_2O_3$-MnO comprised of 9 to 18 mol % of BaO, 65 to 73 mol % of $TiO_2$, and 14 to 19 mol % of $Nd_2O_3$, with 3.0 to 11.0% by weight of $Bi_2O_3$, 0.1 to 2.0% by weight of $Al_2O_3$ and 0.1 to 1.0% by weight of MnO; BaO-MgO-$Ta_2O_5$ of the compositional formula: $Ba_y(Mg_{1-x}Ta_x)O_3$ wherein $0.28 \leq x \leq 0.39$ and $0.98 \leq y \leq 1.00$; $ZrO_2$-$SnO_2$-$TiO_2$ of the compositional formula: $(Zr_{1-x}Sn_x)TiO_4$ wherein $0.1 \leq x \leq 0.3$; SrO-$ZrO_2$-$TiO_2$ of the compositional formula: $Sr_y(Zr_{1-x}Ti_x)O_3$ wherein $0 \leq x \leq 0.1$ and $0.98 \leq y \leq 1.01$; BaO-$Sm_2O_5$-$TiO_2$ of the compositional formula: $xBaO-ySm_2O_5-zTiO_2$ wherein $0.1 \leq x \leq 0.2$, $0.1 \leq y \leq 0.2$, and $0.6 \leq z \leq 0.75$, $PbO-BaO-Nd_2O_3-TiO_2$ of the compositional formula: $xBaO-yNd_2O_3-zTiO_2$ wherein $0.02 \leq x \leq 0.25$, $0.05 \leq y \leq 0.41$, and $0.50 \leq z \leq 0.82$, with up to 17% by weight based on the total of the foregoing oxides of PbO added thereto, and $Li_2O-Na_2O-Sm_2O_5-TiO_2$ of the compositional formula: $(Li_xNa_ySm_z)TiO_3$ wherein $x+y+z=1$, $0.25 \leq x \leq 0.35$, $0.15 \leq y \leq 0.25$, and $0.4 \leq z \leq 0.6$, and the laminate is fired in an atmosphere having an oxygen partial pressure of from more than $1 \times 10^{-4}$ atm to $1 \times 10^{-1}$ atm.

8. The multilayer ceramic part of claim 1, wherein said atmosphere has an oxygen partial pressure of $5 \times 10^{-5}$ atm. to $1 \times 10^{-1}$ atm.

9. The multilayer ceramic part of claim 1, wherein said atmosphere has an oxygen partial pressure of $5 \times 10^{-5}$ atm. to $5 \times 10^{-2}$ atm.

10. The multilayer ceramic part of claim 1, wherein said atmosphere has an oxygen partial pressure of from $5 \times 10^{-5}$ atm. to $1 \times 10^{-2}$ atm.

11. The multilayer ceramic part of claim 1, wherein said pattern is formed of internal conductor consisting essentially of silver.

12. The multilayer ceramic part of claim 1, wherein said pattern is formed of internal conductor consisting of silver.

* * * * *